(12) United States Patent
Watanabe

(10) Patent No.: US 8,809,687 B2
(45) Date of Patent: Aug. 19, 2014

(54) FLEXIBLE PRINTED BOARD AND METHOD OF MANUFACTURING SAME

(75) Inventor: Hirohito Watanabe, Sakura (JP)

(73) Assignee: Fujikura Ltd., Tokyo (JP)

( * ) Notice: Subject to any disclaimer, the term of this patent is extended or adjusted under 35 U.S.C. 154(b) by 276 days.

(21) Appl. No.: 13/077,304

(22) Filed: Mar. 31, 2011

(65) Prior Publication Data

US 2011/0247863 A1    Oct. 13, 2011

(30) Foreign Application Priority Data

Apr. 7, 2010  (JP) ................................. 2010-088694

(51) Int. Cl.
H05K 1/00 (2006.01)
H05K 1/03 (2006.01)
H05K 9/00 (2006.01)

(52) U.S. Cl.
USPC ............ 174/254; 174/255; 174/258; 361/816

(58) Field of Classification Search
CPC ...................................................... H05K 1/028
USPC .......... 174/254, 377, 378, 384, 386; 361/816, 361/818
See application file for complete search history.

(56) References Cited

U.S. PATENT DOCUMENTS

| | | | |
|---|---|---|---|
| 3,612,745 A * | 10/1971 | Warren ......................... | 174/268 |
| 5,639,989 A * | 6/1997 | Higgins, III ................... | 174/386 |
| 6,784,363 B2 * | 8/2004 | Jones ............................ | 174/351 |
| 7,709,750 B2 * | 5/2010 | Hashimoto et al. ........... | 174/378 |
| 2002/0189854 A1 * | 12/2002 | Crumly ......................... | 174/254 |
| 2009/0151988 A1 * | 6/2009 | Lee et al. ...................... | 174/254 |
| 2009/0186295 A1 * | 7/2009 | Win et al. ..................... | 430/270.1 |
| 2009/0314539 A1 * | 12/2009 | Kawaguchi et al. .......... | 174/350 |
| 2011/0108878 A1 * | 5/2011 | Namiki et al. ................. | 257/99 |
| 2011/0114371 A1 * | 5/2011 | Lin et al. ....................... | 174/254 |
| 2011/0132643 A1 * | 6/2011 | Hattori et al. ................. | 174/254 |

FOREIGN PATENT DOCUMENTS

| | | | |
|---|---|---|---|
| JP | 2008-098613 A | 4/2008 | |
| WO | 2007083526 A1 | 7/2007 | |
| WO | WO 2009019963 A1 * | 2/2009 | ............... H05K 9/00 |

OTHER PUBLICATIONS

Machine Translation in English provided of Totouge (WO 200919963 A1) Dec. 11, 2013.*
Office Action issued by the Chinese Patent Office in Chinese Application No. 201110041993.3 dated Apr. 2, 2013.

* cited by examiner

*Primary Examiner* — Chau N Nguyen
*Assistant Examiner* — Roshn Varghese
(74) *Attorney, Agent, or Firm* — Sughrue Mion, PLLC

(57) ABSTRACT

[Object]To provide a flexible printed board improved in bendability.
[Means for solving]The flexible printed board 2 comprises: an insulating substrate 21; a circuit wiring 22 laid on the insulating substrate 21; a circuit protection layer 23 laid on the circuit wiring 22; a shield conductive layer 24 laid on the circuit protection layer 23; and a shield insulating layer 25 laid on the shield conductive layer 24, and is characterized by meeting the following Expression (1).

$0.75 \le E_2/E_1 \le 1.29$     Expression (1)

Note that $E_1$ denotes the tensile elastic modulus of the shield conductive layer 24 and $E_2$ denotes the tensile elastic modulus of the shield insulating layer 25.

7 Claims, 11 Drawing Sheets

FLEXIBLE PRINTED BOARD AND METHOD OF MANUFACTURING SAME

TECHNICAL FIELD

The present invention relates to a flexible printed board which is bendable with a narrow gap (small radius) and a method of manufacturing the same.

The contents described and/or illustrated in the documents relevant to Japanese Patent Application No. 2010-088694 filed on Apr. 7, 2010 will be incorporated herein by reference, as a part of the description and/or drawings of the present application.

BACKGROUND ART

A flexible printed circuit board is known which comprises an electromagnetic shield layer including: a conductive resin layer with thickness of 1 [μm] to 20 [μm]; and an insulating resin layer with thickness of 3 [μm] to 20 [μm] (refer to Patent Document 1, for example).

PRIOR ART DOCUMENTS

Patent Documents

[Patent Document 1] Published patent application (Kokai) No. 2008-98613

SUMMARY OF THE INVENTION

Technical Problem

The above-described flexible printed circuit board, however, has not been contemplated as to how the conductive resin layer of the electromagnetic shield layer formed by screen-printing affects the bendability of the flexible printed circuit board.

Thus, there have been cases where the bendability of flexible printed circuit boards could not been sufficiently improved.

The problem to be solved by the present invention is to provide a flexible printed board capable of improving the bendability thereof and a method of manufacturing such a flexible printed board.

Solution to Problem

The present inventor has focus attention on the point that, at the time of forming a shield conductive layer by screen-printing, the surface of shield conductive layer is necessarily formed with concavities and convexities due to a mesh of a printing plate and on the point that these concavities and convexities cause local stress concentrations to occur within the flexible printed board being bent, and have performed intensive studies thereon. As a result, the present inventor has found out that, by setting the proportion of the tensile elastic modulus of the shield conductive layer and the tensile elastic modulus of a shield insulating layer within a predetermined range, such stress concentrations due to the concavities and convexities of shield conductive layer are allowed to be eased and the above objects can be achieved.

[1] The flexible printed board according to the present invention is a flexible printed board comprising: an insulating substrate; a circuit wiring laid on the insulating substrate; a circuit protection layer laid on the circuit wiring; a shield conductive layer laid on the circuit protection layer; and a shield insulating layer laid on the shield conductive layer, wherein the following Expression (1) is satisfied.

$$0.75 \leq E_2/E_1 \leq 1.29 \qquad \text{Expression (1)}$$

Note that $E_1$ denotes the tensile elastic modulus of the shield conductive layer and $E_2$ denotes the tensile elastic modulus of the shield insulating layer.

[2] In the above invention, the following Expression (2) may be satisfied.

$$1.8[\text{GPa}] \leq E_2 \leq 3.1[\text{GPa}] \qquad \text{Expression (2)}$$

[3] In the above invention, the following Expression (3) may be satisfied.

$$0.79 \leq E_2/E_1 \leq 1.20 \qquad \text{Expression (3)}$$

[4] In the above invention, the tensile elastic modulus of the shield conductive layer and the tensile elastic modulus of the shield insulating layer may be equivalent to each other.

[5] In the above invention, the following Expression (4) may be satisfied.

$$1.9[\text{GPa}] \leq E_2 \leq 2.88[\text{GPa}] \qquad \text{Expression (4)}$$

[6] In the above invention, the shield conductive layer has a surface facing the shield insulating layer and the surface may be concave-convex shape.

[7] The method of manufacturing a flexible printed board according to the present invention is a method of manufacturing the above flexible printed board, comprising: forming the shield conductive layer by screen-printing conductive paste on the circuit protection layer and curing the conductive paste; and forming the shield insulating layer by screen-printing insulating ink on the shield conductive layer and curing the insulating ink.

Advantageous Effect of Invention

According to the present invention, the flexible printed board meets the above Expression (1) thereby to allow stress concentrations due to concavity and convexity of the shield conductive layer to be eased, and the bendability of the flexible printed board can be improved.

DESCRIPTION OF EMBODIMENTS

Below, embodiments of the present invention will be explained based on the drawings.

Figure 1:
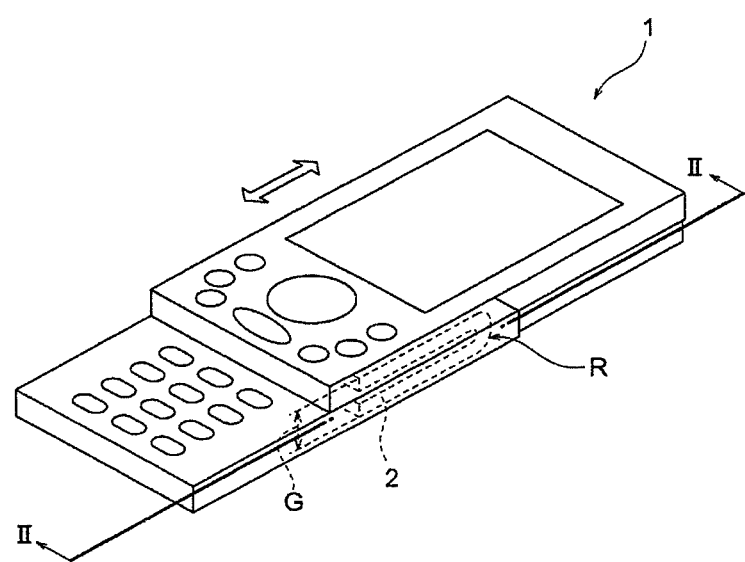
FIG. 1 is a perspective view of a sliding-type mobile phone according to an embodiment of the present invention.
Figure 2:
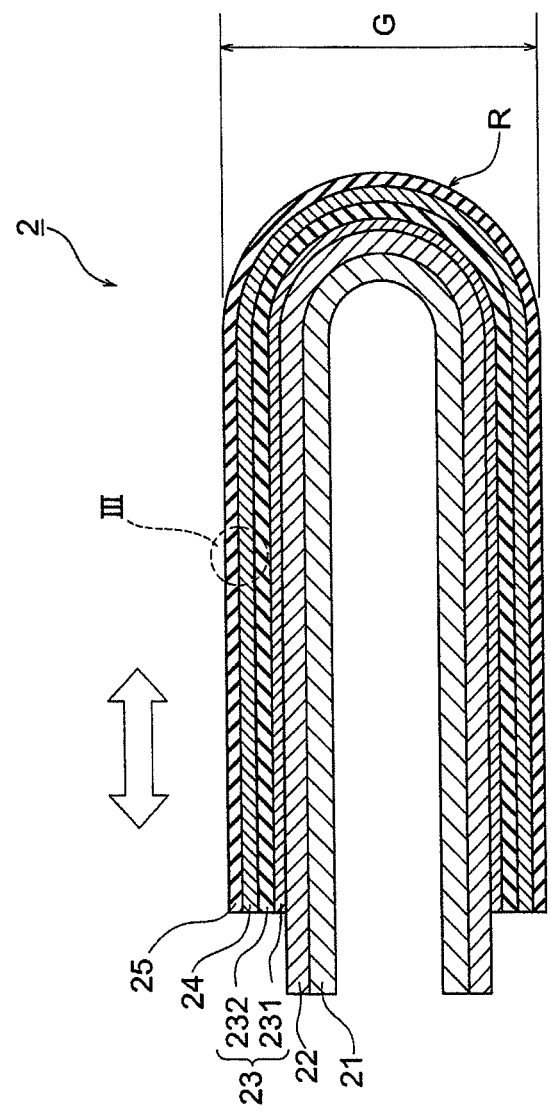
FIG. 2 is an enlarged cross sectional view of a flexible printed board along the line II-II of FIG. 1.
Figure 3:
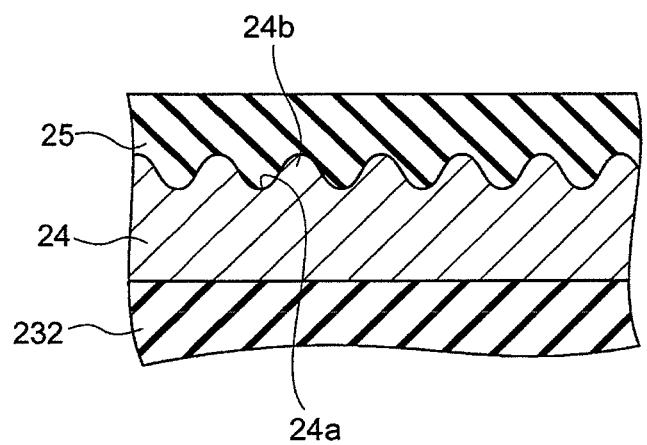
FIG. 3 is a partial cross sectional view of a part III of FIG. 2.

FIG. 1 is a perspective view of a sliding-type mobile phone according to the present embodiment, FIG. 2 is an enlarged cross sectional view of a flexible printed board along the line II-II of FIG. 1, and FIG. 3 is a partial cross sectional view of a part III of FIG. 2.

Flexible printed board (or FPC: Flexible Printed Circuit) 2 according to the present embodiment is, for example as shown in FIG. 1, incorporated in a sliding-type mobile phone 1 in the situation where the flexible printed board 2 is bent substantially in 180 degrees with a small radius R (e.g. approximately 0.7 mm) and a gap G is narrow.

This flexible printed board 2 comprises, as shown in FIG. 2, an insulating substrate (base material) 21, a circuit wiring 22, a circuit protection layer 23, a shield conductive layer 24, and a shield insulating layer 25.

The insulating substrate 21 is a layer which is located at the innermost position in the status where the flexible printed board 2 is bent as shown in FIG. 2. This insulating substrate 21 is composed of a material having flexibility, such as polyimide, for example. Alternatively, the insulating substrate 21 may also be composed of polyethylene naphthalate (PEN), polyethylene terephthalate (PET), or the like.

The circuit wiring 22 is, as shown in FIG. 2, laid between the insulating substrate 21 and the circuit protection layer 23, and both ends thereof are exposed from the circuit protection layer 23. This circuit wiring 22 is composed of a material having conductivity, such as copper, for example. This circuit wiring 22 is formed by etching a single-sided copper clad laminate (copper foil), for example.

The circuit protection layer 23, which is laid on the circuit wiring 22, protects the circuit wiring 22. As this circuit protection layer 23, a coverlay film may be mentioned, for example.

The circuit protection layer 23 has an adhesion layer 231 and an insulating film 232.

The adhesion layer 231, which covers the circuit wiring 22 as shown in FIG. 2, causes the circuit wiring 22 and the insulating film 232 to adhere to each other. This adhesion layer 231 is composed of adhesive comprising epoxy-base resin, for example.

The insulating film 232, which is laid on the adhesion layer 231 as shown in FIG. 2, protects the circuit wiring 22. This insulating film 232 is composed of a material having flexibility, such as polyimide, for example.

The shield conductive layer 24, which is laid on the insulating film 232, electromagnetically shields the circuit wiring 22 from external. This shield conductive layer 24 is formed by screen-printing and curing conductive paste. Now, it is assumed in the present embodiment that the tensile elastic modulus of the shield conductive layer 24 is $E_1$.

The surface of shield conductive layer 24 facing the shield insulating layer 25 is continuously concave-convex shape, as shown in FIG. 3. Note that the concave-convex shape surface is caused from the roughness of mesh 32 (refer to FIG. 6) of printing plate 30 used for screen-printing. As will be described herein in detail, the concave-convex shape surface is formed with concave portions 24a of the concave-convex shape surface located at positions having faced wires 32a of mesh 32 (refer to FIG. 6) and convex portions 24b of the concave-convex shape surface located at positions having faced openings 32b of mesh 32 (refer to FIG. 6) during screen-printing.

As the conductive paste for forming the shield conductive layer 24, silver paste may be mentioned. Silver paste contains silver particle and binder. As materials for the binder, polyester-base resin may be mentioned, for example. Note that the conductive paste for forming the shield conductive layer 24 is not limited to silver paste. For example, the conductive paste may also be composed of gold paste, copper paste, carbon paste, and the like. Also materials for the binder are not particularly limited.

The shield insulating layer 25, which is laid on the shield conductive layer 24, protects the shield conductive layer 24. This shield insulating layer 25 is composed of organic coating film obtained by screen-printing and curing insulating ink (black ink). Although not particularly limited, as a material for the insulating ink, polyester-base resin may be mentioned. Here, it is assumed in the present embodiment that the tensile elastic modulus of the shield insulating layer 25 is $E_2$.

This shield insulating layer 25 has a surface which faces the shield conductive layer 24 and has a concave-convex shape corresponding to the shape (concave-convex shape) of the shield conductive layer 24. In contrast, outer surface of the shield insulating layer 25 is formed smoothly at the opposite side to the shield conductive layer 24.

For the flexible printed board 2 according to the present embodiment, it is preferred that the tensile elastic modulus $E_1$ of the shield conductive layer 24 and the tensile elastic modulus $E_2$ of the shield insulating layer 25 meet the following Expression (1), and more preferred is that the following Expression (3) is satisfied. Furthermore preferred is that the tensile elastic modulus $E_1$ of the shield conductive layer and the tensile elastic modulus $E_2$ of the shield insulating layer are equivalent to each other ($E_1=E_2$).

$$0.75 \leq E_2/E_1 \leq 1.29 \qquad \text{Expression (1)}$$

$$0.79 \leq E_2/E_1 \leq 1.20 \qquad \text{Expression (3)}$$

In addition, for the flexible printed board 2 according to the present embodiment, it is preferred that the tensile elastic modulus $E_2$ of the shield insulating layer 25 meets the following Expression (2), and more preferred is that the following Expression (4) is satisfied.

$$1.8[\text{GPa}] \leq E_2 \leq 3.1[\text{GPa}] \qquad \text{Expression (2)}$$

$$1.9[\text{GPa}] \leq E_2 \leq 2.88[\text{GPa}] \qquad \text{Expression (4)}$$

Although, in the flexible printed board 2 according to the present embodiment, the circuit wiring 22, the circuit protection layer 23, the shield conductive layer 24, and the shield insulating layer 25 are laid on one main surface (outer surface) of the insulating substrate 21, the present invention is not particularly limited to this. For example, a circuit wiring, a circuit protection layer, a shield conductive layer, and a shield insulating layer may be laid on the inner main surface of an insulating substrate. Alternatively, circuit wirings, circuit protection layers, shield conductive layers, and shield insulating layers may be laid on both surfaces of an insulating substrate.

Functions of the present embodiment will be described hereinafter.

In a flexible printed board having been formed with a shield conductive layer by screen-printing, the surface of the shield conductive layer has concave-convex shape as described above. As a consequence, if the tensile elastic modulus of the shield conductive layer and the tensile elastic modulus of a shield insulating layer are significantly different from each other, local stress concentrations tend to occur within the flexible printed board.

More specifically, in such a flexible printed board, because thick portions of a hard layer and thin portions of the hard layer alternately reside, the entire hardness of the flexible printed board comes to be inhomogeneous. Consequently, the thin portions of the hard layer (which are easily bent) may locally have small bending radiuses thereby causing stress concentrations to readily occur in such thin portions.

For example, if the shield conductive layer is relatively soft and the shield insulating layer is relatively hard, in the flexible printed board, portions of which the shield insulating layer is thin (portions corresponding to the convex portions of the shield conductive layer), are more easily bent than portions of which the shield insulating layer is thick (portions corresponding to the concave portions of the shield conductive layer), and therefore the portions of which the shield insulating layer is thin in the flexible printed board are caused to have local stress concentrations. Thus, portions with stress concentrations may cause the circuit wiring to crack thereby being easy to break.

In contrast, according to the present embodiment, the proportion of the tensile elastic modulus $E_2$ of the shield insulating layer 25 to the tensile elastic modulus $E_1$ of the shield conductive layer 24 is set within a predetermined range as represented by the above Expression (1) such that hardnesses of the shield conductive layer 24 and the shield insulating layer 25 match each other as much as possible. Accordingly, even though the surface of the shield conductive layer 24 comes to be of concave-convex shape by screen-printing, local stress concentrations are suppressed from occurring.

In addition, the tensile elastic modulus $E_2$ of shield insulating layer 25 meeting the above Expression (2) allows stress concentrations to be more eased thereby further improving the bendability of a flexible printed board.

Hereinafter, the method of manufacturing flexible printed boards according to the present embodiment will be described.

Figure 4:
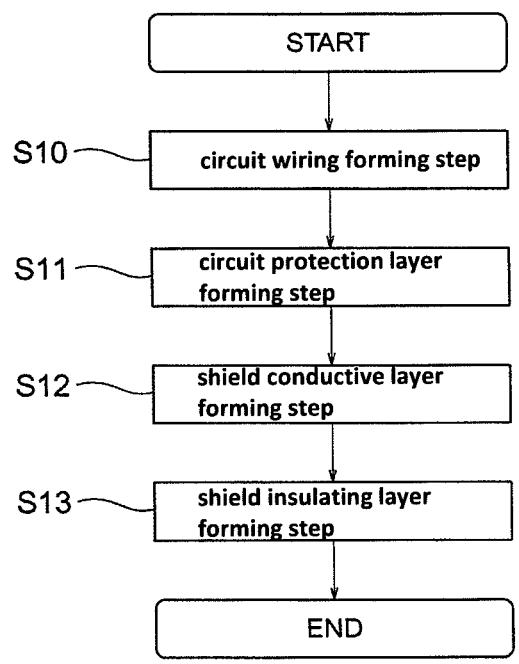
FIG. 4 is a flowchart illustrating a method of manufacturing flexible printed boards in an embodiment of the present invention.
Figure 5:
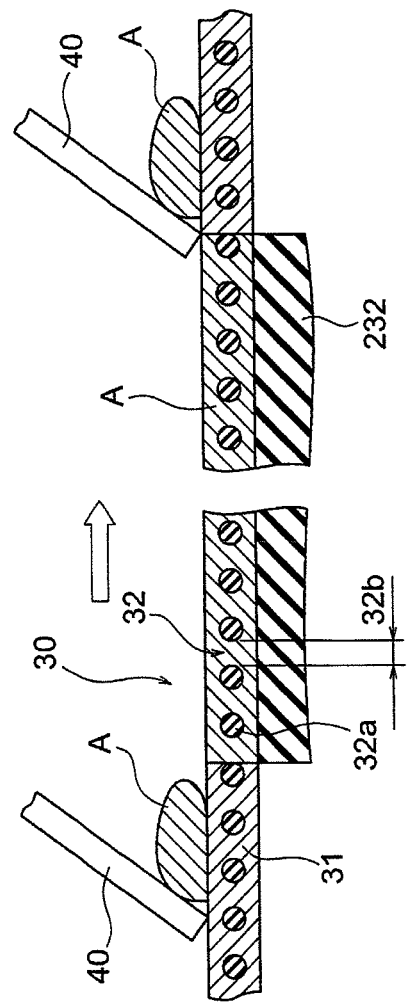
FIG. 5 is an enlarged cross sectional view (part 1) illustrating a shield conductive layer forming step of FIG. 4.
Figure 6:
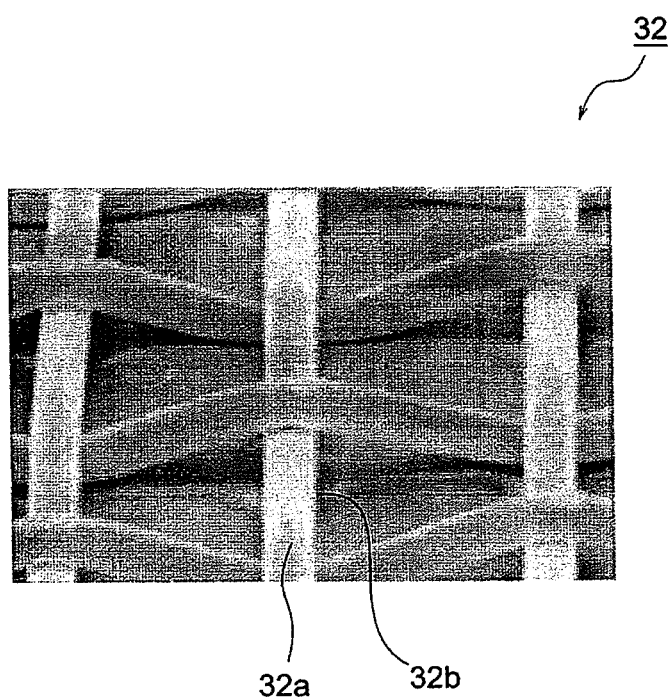
FIG. 6 is a photograph presenting a mesh of printing plate used in the shield conductive layer forming step of FIG. 4.
Figure 7:
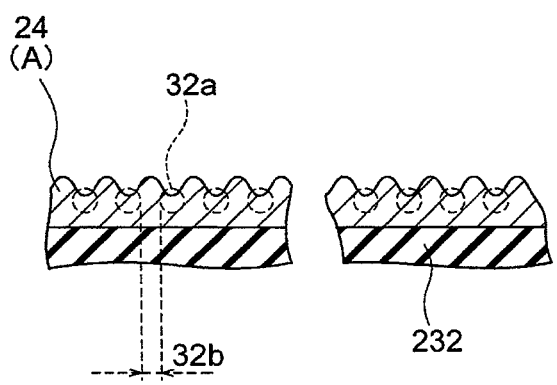
FIG. 7 is an enlarged cross sectional view (part 2) illustrating the shield conductive layer forming step of FIG. 4.

FIG. 4 is a flowchart illustrating a method of manufacturing flexible printed boards according to the present embodiment, FIG. 5 and FIG. 7 are enlarged cross sectional views illustrating a shield conductive layer forming step of FIG. 4, and FIG. 6 is a photograph presenting a mesh of printing plate used in the shield conductive layer forming step of FIG. 4.

The method of manufacturing flexible printed boards according to the present embodiment comprises, as shown in FIG. 4, circuit wiring forming step S10, circuit protection layer forming step S11, shield conductive layer forming step S12, and shield insulating layer forming step S13. At the time of manufacturing the flexible printed board 2, a single-sided copper clad laminate may be prepared which is configured of the insulating substrate 21 laid with copper foil on one surface thereof.

At first, in the circuit wiring forming step S10, the circuit wiring 22 is formed by etching the copper foil of the single-sided copper clad laminate.

Next, in the circuit protection layer forming step S11, a coverlay film is laid on the circuit wiring 22 to form the circuit protection layer 23. At this time, the adhesion layer 231 of the coverlay film is caused to adhere to the circuit wiring 22 so that both ends of the circuit wiring 22 are exposed from the coverlay film.

In the shield conductive layer forming step S12, conductive paste is screen-printed and then cured on the insulating film 232 of the coverlay film to form the shield conductive layer 24. More specifically describing the shield conductive layer forming step S12, as shown in FIG. 5, a squeegee 40 is moved on the upper surface of printing plate 30 formed with a mask 31 defined by emulsion while being pressed over conductive paste A.

This printing plate 30 comprises mesh 32 consisting of wirings 32a woven in a grid-like structure, as shown in FIG. 6. The mesh size of this mesh 32 is approximately 200 mesh. On the other hand, the binder of conductive paste passing through this mesh 32 has a relatively high viscosity approximately within the range of 200 [dPa·s at 25° C.] to 300 [dPa·s at 25° C.], for example.

For these reasons, in the shield conductive layer forming step S12 according to the present embodiment, as shown in FIG. 7, the conductive paste A is laid on the insulating film 232 with larger thickness at portions facing the openings 32b of mesh 32 and with smaller thickness at portions facing the wires 32a. The shield conductive layer 24 having a surface of continuously concave-convex shape is formed after the curing of the conductive paste A.

Thereafter, in the shield insulating layer forming step S13, insulating ink made of polyester-base resin is screen-printed and then cured on the concave-convex shaped surface of the shield conductive layer 24.

Likewise, for the screen-printing in the shield insulating layer forming step S13, a printing plate formed with mesh consisting of wires is also used similarly for the screen-printing in the shield conductive layer forming step S12. Note that the mesh size of this mesh of the printing plate used in the shield insulating layer forming step S13 is approximately 150 mesh, for example.

Also note that the viscosity of this insulating ink used in the shield insulating layer forming step S13 is relatively low compared with that of the binder of the above-described conductive paste A, and is approximately within the range of 50 [dPa·s at 25° C.] to 150 [dPa·s at 25° C.], for example.

As a consequence, when the insulating ink is printed onto the concave-convex shaped shield conductive layer 24, the insulating ink fills the concave-convex shape of the shield conductive layer 24 on the surface of the shield insulating layer 25 contacting with the shield conductive layer 24, while the outer surface of the shield insulating layer 25 comes to be flat (refer to FIG. 3).

Thus, according to a method of manufacturing flexible printed boards where a shield conductive layer is formed by screen-printing, the surface of the shield conductive layer comes to necessarily be concave-convex shape. Therefore, if the tensile elastic modulus $E_1$ of the shield conductive layer and the tensile elastic modulus $E_2$ of the shield insulating layer are significantly different from each other, then local stress concentrations tend to occur within the flexible printed board because both thick portions of a hard layer (e.g. the shield insulating layer) and thin portions of the hard layer are created in the flexible printed board and the thin portions of the hard layer may locally have small bending radiuses.

As opposed to this, the proportion of the tensile elastic modulus $E_2$ of shield insulating layer 25 to the tensile elastic modulus $E_1$ of shield conductive layer 24 is set within a predetermined range as represented by the above Expression (1) or Expression (3) thereby easing local stress concentrations as described above to improve the bendability of the flexible printed board 2.

More specifically, the conductive paste constituting the shield conductive layer 24 and the insulating ink constituting the shield insulating layer 25 are chosen so that the tensile elastic moduli $E_1$ and $E_2$ meet the above Expression (1) or Expression (3). More preferably, the conductive paste constituting the shield conductive layer 24 and the insulating ink constituting the shield insulating layer 25 are chosen so that the tensile elastic moduli $E_1$ and $E_2$ are equivalent to each other ($E_1=E_2$).

In addition, the tensile elastic modulus $E_2$ of shield insulating layer 25 meeting the above Expression (2) or Expression (4) allows stress concentrations to be more eased thereby further improving the bendability of the flexible printed board.

It is to be noted that the embodiments as explained above are described to facilitate understanding of the present invention and are not described to limit the present invention. Therefore, it is intended that the elements disclosed in the above embodiments include all substitutions, modifications, equivalents and the like to fall within the technical scope of the present invention.

EXAMPLES

As will be described hereinafter, advantageous effects of the present invention were confirmed in terms of examples embodied with the present invention and comparative examples thereto. The following examples and comparative examples are for the confirmation of advantageous effects as to the improvement in bendability of the flexible printed boards according to the above-described embodiments.

Figure 8:
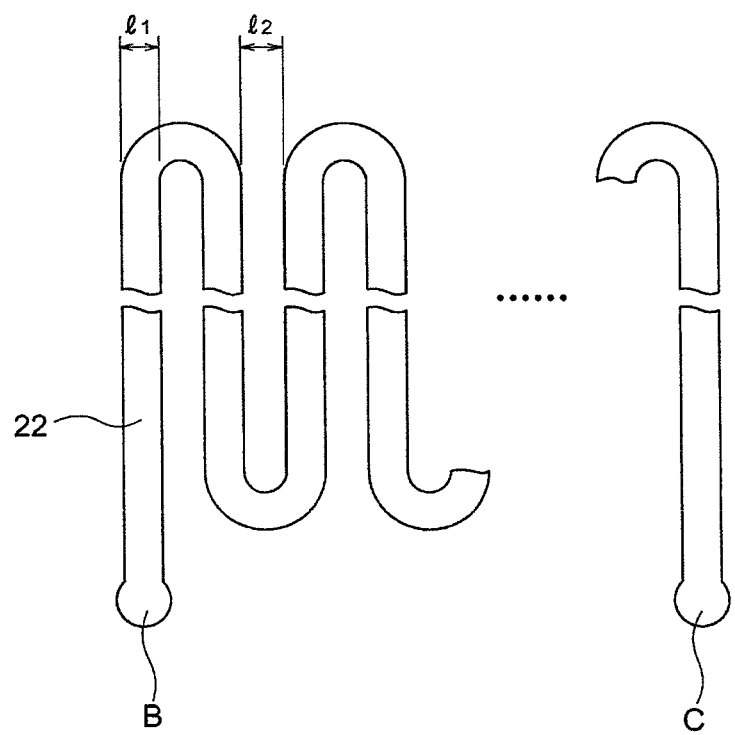
FIG. 8 is a plan view of a circuit wiring in examples according to the present invention and comparative examples.
Figure 9:
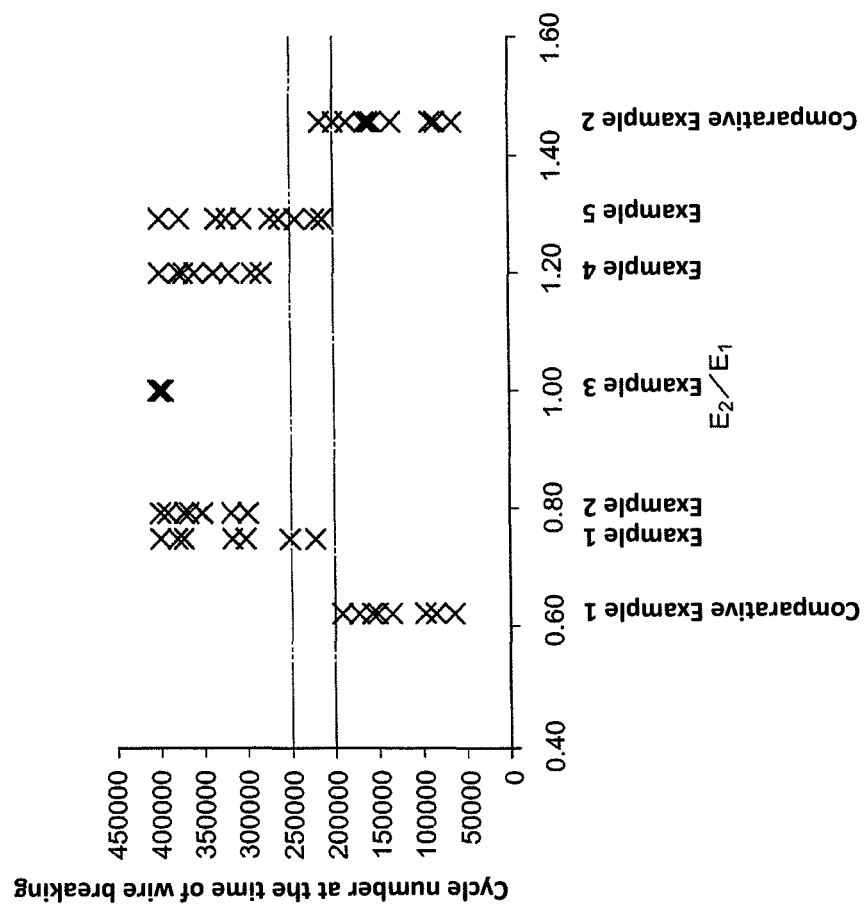
FIG. 9 is a graph showing results of slide test in Examples 1 to 5 according to the present invention and Comparative Examples 1 and 2.
Figure 10:
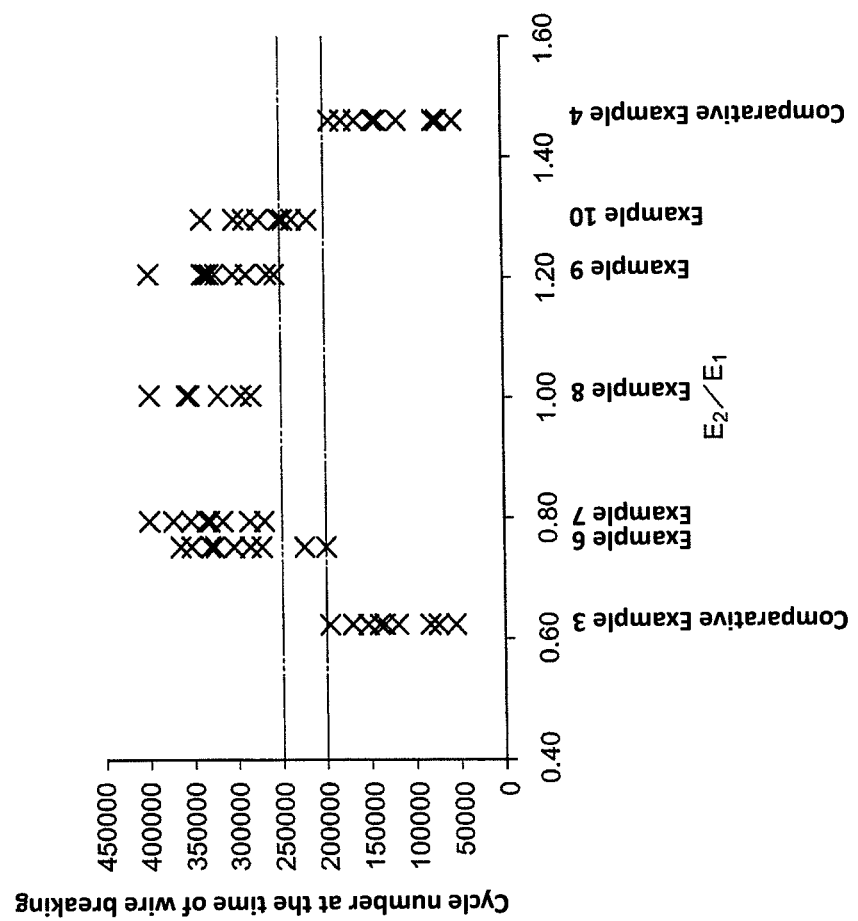
FIG. 10 is a graph showing results of slide test in Examples 6 to 10 according to the present invention and Comparative Examples 3 and 4.
Figure 11:
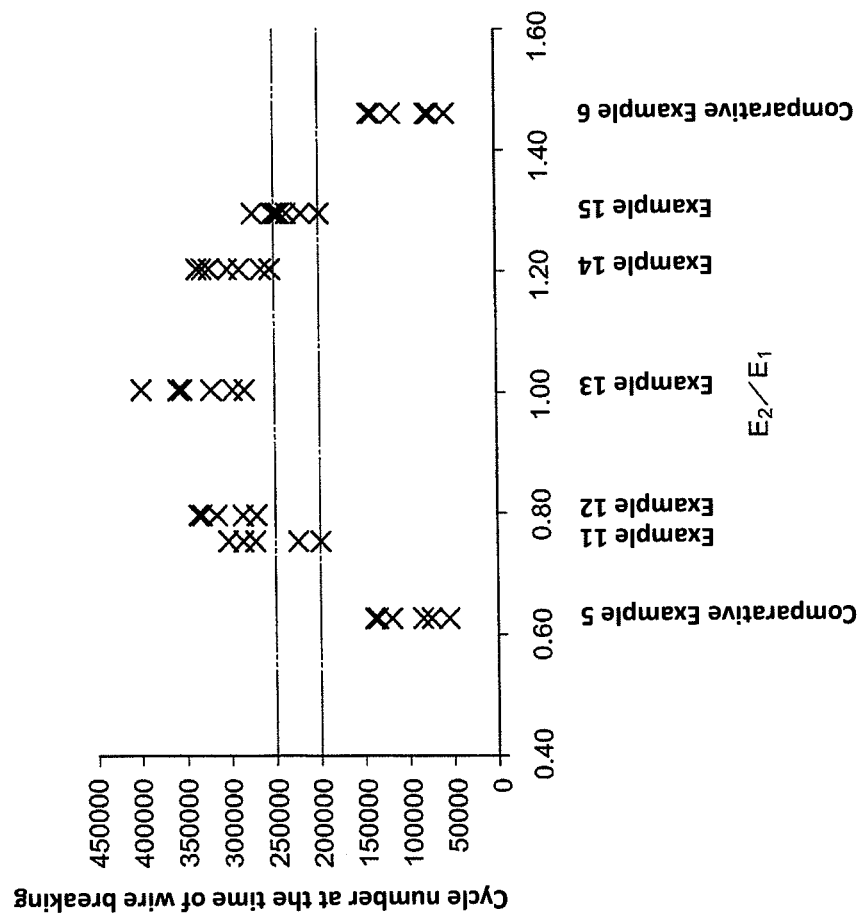
FIG. 11 is a graph showing results of slide test in Examples 11 to 15 according to the present invention and Comparative Examples 5 and 6.

FIG. 8 is a plan view of a circuit wiring for the examples and comparative examples, FIG. 9 to FIG. 11 are graphs showing results of slide tests for the examples and comparative examples.

Example 1

In terms of Example 1, ten samples of flexible printed boards each having the same configuration as the above embodiments were prepared (Samples 1 to 10).

For these samples according to Example 1, the insulating substrates were composed of polyimide, the circuit wirings were composed of copper, the circuit protection layers were composed of coverlay films, the shield conductive layers were composed of silver paste, and the shield insulating layers were composed of insulating ink. Note that the adhesion layers of the coverlay films were composed of adhesive of epoxy-base resin, and the insulating films were composed of polyimide. Also note that, as the binder of the silver paste, polyester-base resin having viscosity of approximately 200 [dPa·s at 25° C.] to 300 [dPa·s at 25° C.] was used. Still also note that, as the insulating ink, polyester-base resin having viscosity of approximately 50 [dPa·s at 25° C.] to 150 [dPa·s at 25° C.] was used.

The thicknesses were set for these samples according to Example 1 with the insulating boards of 12.5 [μm], the circuit wirings of 12 [μm], the adhesion layers of 20 [μm], and the insulating films of 12.5 [μm]. The average thicknesses of the shield conductive layers were set to be 10 [μm], and the average thicknesses of the shield insulating layers were also set to be 10 [μm].

For the samples according to Example 1, the circuit wirings 22 were formed to be patterns as illustrated in FIG. 8 by etching. Note that the width $1_1$ of the circuit wiring 22 was designed as being 75 μm and the intervals $1_2$ thereof also being 75 μm.

For the samples according to Example 1, the shield conductive layers were formed by screen-printing silver paste on the insulating films and then curing the silver paste. Note that a printing plate of 200 mesh was used for the screen-printing of silver paste.

For the samples according to Example 1, the shield insulating layers were formed by screen-printing insulating ink on the shield conductive layers and then curing the insulating ink. Note that a printing plate of 150 mesh was used for the screen-printing of insulating ink.

Slide test was performed for each sample according to Example 1. In the slide test, one end of a flexible printed board was fixed in the status where the flexible printed board was bent to have the radius of 0.7 [mm] in 180 degrees with its insulating substrate being located inside (in the status where the gap G shown in FIG. 2 is 1.4 [mm]), the other end of the flexible printed board was repeated to reciprocate slidingly (up to 400,000 times), and cycle number of the sliding reciprocation was measured when the circuit wiring was broken.

In this slide test, the electrical resistance value of the circuit wiring (between the points B and C shown in FIG. 8) was measured while repeating the sliding reciprocation with the speed of one cycle during two seconds and with the stroke of 20 [mm] for the sliding reciprocation. In the present example, regarding the circuit wiring as being broken at the time of the electrical resistance value having increased 20% or more compared with the initial value thereof, the cycle number at that time was estimated as "cycle number at the time of wire breaking". Measurement results in Example 1 are shown in Table 1 and FIG. 9.

TABLE 1

| | | Example 1 | Example 2 | Example 3 | Example 4 | Example 5 | Comparative Example 1 | Comparative Example 2 |
|---|---|---|---|---|---|---|---|---|
| Tensile elastic modulus $E_1$ [GPa] of shield conductive layer | | 2.4 | 2.4 | 2.4 | 2.4 | 2.4 | 2.4 | 2.4 |
| Tensile elastic modulus $E_2$ [GPa] of shield insulating layer | | 1.8 | 1.9 | 2.4 | 2.88 | 3.1 | 1.5 | 3.5 |
| E2/E1 | | 0.75 | 0.79 | 1.00 | 1.20 | 1.29 | 0.63 | 1.46 |
| Cycle number at the time of wire breaking | Sample 1 | 400000 | 400000 | 400000 | 400000 | 400000 | 191868 | 214973 |
| | Sample 2 | 400000 | 400000 | 400000 | 400000 | 376675 | 172732 | 198888 |
| | Sample 3 | 400000 | 392985 | 400000 | 378234 | 334664 | 157470 | 183474 |
| | Sample 4 | 379154 | 372546 | 400000 | 377251 | 323713 | 153142 | 163025 |
| | Sample 5 | 374275 | 367382 | 400000 | 372480 | 305323 | 150124 | 157969 |
| | Sample 6 | 317829 | 352891 | 400000 | 360842 | 274135 | 134983 | 155538 |
| | Sample 7 | 303000 | 351686 | 400000 | 338304 | 264109 | 133739 | 131701 |
| | Sample 8 | 250636 | 318807 | 400000 | 320421 | 244726 | 94148 | 86963 |
| | Sample 9 | 250188 | 301322 | 400000 | 294315 | 221222 | 84252 | 81472 |
| | Sample 10 | 222808 | 300495 | 397080 | 285081 | 213863 | 62068 | 62142 |
| Evaluation | | B | A | A | A | B | C | C |

Note that the "Evaluation" in Table 1 indicates "C" as being unacceptable if at least one of ten samples shows less than 200,000 times of the cycle number at the time of wire breaking, "B" as being acceptable if every ten samples show 200,000 times or more of the cycle number at the time of wire breaking, and "A" as being acceptable and more preferable if every ten samples show 250,000 times or more of the cycle number at the time of wire breaking (likewise also for Examples 2 to 15 and Comparative Examples 1 to 6). Also note that the graph of FIG. 9 is plotted with each cycle number at the time of wire breaking for Samples 1 to 10 of Example 1 (likewise also for Examples 2 to 5 and Comparative Examples 1 and 2).

For the samples according to Example 1, the tensile elastic modulus $E_1$ of each shield conductive layer was estimated as being 2.4 [GPa] and the tensile elastic modulus $E_2$ of each shield insulating layer was estimated as being 1.8 [GPa]. Estimation of the tensile elastic moduli of the shield conductive layers and the shield insulating layers was performed using the following method (likewise also for Examples 2 to 15 and Comparative Examples 1 to 6).

For shield conductive layers, the tensile elastic modulus $E_1$ was estimated by preparing samples for estimation different from the samples of Example 1 and performing tensile test for these samples for estimation based on JIS K 7127 standard of Japanese Industrial Standards (JIS).

More specifically, the samples of the shield conductive layers for estimation were punched into the shape defined as test specimen of type-2 in the above standard using a Victoria-type punching die, and the samples for estimation with the shape of type-2 test specimen were pulled until their fracture with the pulling speed of 50 [mm/min].

At that time, the extension of each sample for estimation was measured in terms of the load applied thereto, and stress-strain diagram was made with vertical axis of stress (load) and horizontal axis of strain (extension). In the present example, each measured data was connected with the origin coordinate by a straight line within the section from the origin coordinate to the yield point in the stress-strain diagram, and the maximum value of gradient among these straight lines was estimated as the tensile elastic modulus $E_1$ of the shield conductive layer.

Note that these samples of the shield conductive layers for estimation were prepared as below. At first silver paste similar to that for samples of Example 1 was printed on each film and cured at the similar temperature to samples of Example 1, and the silver paste was heated again at the insulating ink curing temperature (the temperature caused by a heat applied to samples in order for the insulating ink to be cured) similar to that for samples of Example 1. That is, this silver paste was subjected to the same thermal history as the shield conductive layers of Example 1. Thereafter, these samples of the shield conductive layers for estimation were obtained by removing the cured silver paste from each film.

Also for the shield insulating layers, the tensile elastic modulus $E_2$ of the shield insulating layer was estimated in the same manner as the above shield conductive layers by performing tensile test for samples for estimation different from the samples of Example 1. Note that the tensile test for the samples of the shield insulating layers for estimation was also performed based on JIS K 7127 standard of Japanese Industrial Standards (JIS), similarly to the above tensile test for the samples of the shield conductive layers for estimation.

Also note that the samples of the shield insulating layer for estimation were prepared as below. At first insulating ink similar to that for samples of Example 1 was printed on each film and cured at the similar temperature as for samples of Example 1. That is, this insulating ink was subjected to the same thermal history as the shield insulating layers of Example 1. Thereafter, these samples of the shield insulating layers for estimation were obtained by removing the cured insulating ink from each film.

Examples 2 to 5

For Examples 2 to 5, as shown in Table 1, each ten samples having the same configuration as Example 1 were prepared with the exception of the tensile elastic modulus $E_2$ of the shield insulating layer being 1.9 [GPa], 2.4 [GPa], 2.88 [GPa], and 3.1 [GPa], respectively.

Slide test was performed for each sample according to these Examples 2 to 5 in the similar manner as Example 1. Results for Examples 2 to 5 are shown in Table 1 and FIG. 9.

Example 6

For Example 6, each ten samples having the same configuration as Example 1 were prepared with the exception of the thickness of the adhesion layer of the coverlay film being 30 [μm] (Samples 1 to 10). Slide test was performed for each sample according to these samples of Example 6 in the similar manner as Example 1. Results for Example 6 are shown in Table 2 and FIG. 10. Note that the graph of FIG. 10 is plotted with each cycle number at the time of wire breaking for Samples 1 to 10 of Example 6 (likewise also in Examples 7 to 10 and Comparative Examples 3 and 4).

TABLE 2

|  |  | Example 6 | Example 7 | Example 8 | Example 9 | Example 10 | Comparative Example 3 | Comparative Example 4 |
|---|---|---|---|---|---|---|---|---|
| Tensile elastic modulus $E_1$ [GPa] of shield conductive layer | | 2.4 | 2.4 | 2.4 | 2.4 | 2.4 | 2.4 | 2.4 |
| Tensile elastic modulus $E_2$ [GPa] of shield insulating layer | | 1.8 | 1.9 | 2.4 | 2.88 | 3.1 | 1.5 | 3.5 |
| $E_2/E_1$ | | 0.75 | 0.79 | 1.00 | 1.20 | 1.29 | 0.63 | 1.46 |
| Cycle number at the time of wire breaking | Sample 1 | 364981 | 400000 | 400000 | 400000 | 339879 | 197308 | 193475 |
| | Sample 2 | 353486 | 373329 | 400000 | 340410 | 339007 | 172681 | 178999 |
| | Sample 3 | 331238 | 353686 | 400000 | 339525 | 301197 | 155458 | 165126 |
| | Sample 4 | 326847 | 335291 | 398763 | 335232 | 291341 | 141723 | 146722 |
| | Sample 5 | 303386 | 330643 | 357372 | 330347 | 274790 | 137827 | 142172 |
| | Sample 6 | 286046 | 317601 | 356229 | 324757 | 251253 | 135111 | 139984 |
| | Sample 7 | 272700 | 316517 | 353686 | 304473 | 246721 | 120365 | 118530 |
| | Sample 8 | 225572 | 286926 | 321002 | 288378 | 237698 | 84733 | 78266 |
| | Sample 9 | 225169 | 271189 | 298110 | 264883 | 236553 | 75826 | 73326 |

TABLE 2-continued

|  | Example 6 | Example 7 | Example 8 | Example 9 | Example 10 | Comparative Example 3 | Comparative Example 4 |
|---|---|---|---|---|---|---|---|
| Sample 10 | 200527 | 270445 | 283686 | 256572 | 220253 | 55861 | 55927 |
| Evaluation | B | A | A | A | B | C | C |

Examples 7 to 10

For Examples 7 to 10, as shown in Table 2, each ten samples having the same configuration as Example 1 were prepared with the exception of the tensile elastic modulus $E_2$ of the shield insulating layer being 1.9 [GPa], 2.4 [GPa], 2.88 [GPa], and 3.1 [GPa], respectively, and the thickness of the adhesion layer of the coverlay film being 30 [μm] (Samples 1 to 10).

Slide test was performed for each sample according to these Examples 7 to 10 in the similar manner as Example 1. Results for Examples 7 to 10 are shown in Table 2 and FIG. 10.

Example 11

For Example 11, each ten samples having the same configuration as Example 1 were prepared with the exception of the average thickness of the shield conductive layer being 20 [μm] (Samples 1 to 10). Slide test was performed for each sample according to these samples of Example 11 in the similar manner as Example 1. Results for Example 11 are shown in Table 3 and FIG. 11. Note that the graph of FIG. 11 is plotted with each cycle number at the time of wire breaking for Samples 1 to 10 of Example 11 (likewise also in Examples 12 to 15 and Comparative Examples 5 and 6).

Examples 12 to 15

For Examples 12 to 15, each ten samples having the same configuration as Example 1 were prepared with the exception of the average thickness of the shield conductive layer being 20 [μm] and the tensile elastic modulus $E_2$ of the shield insulating layer being 1.9 [GPa], 2.4 [GPa], 2.88 [GPa], and 3.1 [GPa], respectively, as shown in Table 3 (Samples 1 to 10)

Slide test was performed for each sample according to these Examples 12 to 15 in the similar manner as Example 1. Results for Examples 12 to 15 are shown in Table 3 and FIG. 11.

Comparative Example 1

For Comparative Example 1, as shown in Table 1, ten samples having the same configuration as Example 1 were prepared with the exception of the tensile elastic modulus $E_2$ of the shield insulating layer being 1.5 [GPa] (Samples 1 to 10).

Slide test was performed for these samples according to Comparative Example 1 in the similar manner as Example 1. Results for Comparative Example 1 are shown in Table 1 and FIG. 9.

Comparative Example 2

For Comparative Example 2, as shown in Table 1, ten samples having the same configuration as Example 1 were prepared with the exception of the tensile elastic modulus $E_2$ of the shield insulating layer being 3.5 [GPa] (Samples 1 to 10).

TABLE 3

|  |  | Example 11 | Example 12 | Example 13 | Example 14 | Example 15 | Comparative Example 5 | Comparative Example 6 |
|---|---|---|---|---|---|---|---|---|
| Tensile elastic modulus $E_1$ [GPa] of shield conductive layer | | 2.4 | 2.4 | 2.4 | 2.4 | 2.4 | 2.4 | 2.4 |
| Tensile elastic modulus $E_2$ [GPa] of shield insulating layer | | 1.8 | 1.9 | 2.4 | 2.88 | 3.1 | 1.5 | 3.5 |
| $E_2/E_1$ | | 0.75 | 0.79 | 1.00 | 1.20 | 1.29 | 0.63 | 1.46 |
| Cycle number at the time of wire breaking | Sample 1 | 303322 | 330400 | 399435 | 288525 | 246658 | 141484 | 140376 |
| | Sample 2 | 285545 | 317672 | 399826 | 264461 | 237150 | 137285 | 118884 |
| | Sample 3 | 272381 | 316173 | 398810 | 256368 | 236333 | 135097 | 77974 |
| | Sample 4 | 225332 | 334834 | 356944 | 335213 | 219832 | 120426 | 73261 |
| | Sample 5 | 225264 | 330735 | 356205 | 330463 | 274439 | 84507 | 142485 |
| | Sample 6 | 285551 | 317890 | 353815 | 324699 | 250680 | 134969 | 140097 |
| | Sample 7 | 272262 | 315980 | 353270 | 304733 | 246505 | 120764 | 118781 |
| | Sample 8 | 225149 | 286718 | 321074 | 288033 | 237667 | 84502 | 78333 |
| | Sample 9 | 224775 | 271537 | 297679 | 265209 | 236370 | 75856 | 72828 |
| | Sample 10 | 200381 | 269969 | 283944 | 256036 | 200046 | 56185 | 56070 |
| Evaluation | | B | A | A | A | B | C | C |

Slide test was performed for these samples according to Comparative Example 2 in the similar manner as Example 1. Results for Comparative Example 2 are shown in Table 1 and FIG. 9.

Comparative Examples 3 and 4

For Comparative Examples 3 and 4, as shown in Table 2, each ten samples having the same configuration as Example 1 were prepared with the exception of the tensile elastic modulus $E_2$ of the shield insulating layer being 1.5 [GPa] and 3.5

[GPa], respectively, and the thickness of the adhesion layer of the coverlay film being 30 [μm] (Samples 1 to 10).

Slide test was performed for each sample according to these Comparative Examples 3 and 4 in the similar manner as Example 1. Results for Comparative Examples 3 and 4 are shown in Table 2 and FIG. 10.

Comparative Examples 5 and 6

For Comparative Examples 5 and 6, each ten samples having the same configuration as Example 1 were prepared with the exception of the average thickness of the shield conductive layer being 20 [μm] and the tensile elastic modulus $E_2$ of the shield insulating layer being 1.5 [GPa] and 3.5 [GPa], respectively, as shown in Table 3 (Samples 1 to 10).

Slide test was performed for each sample according to these Comparative Examples 5 and 6 in the similar manner as Example 1. Results for Comparative Examples 5 and 6 are shown in Table 3 and FIG. 11.

<Consideration>

As shown in Table 1, Examples 1 to 5 involved only "A" and "B" indicating as being acceptable. In contrast, samples according to Comparative Examples 1 and 2 mostly broke until cycle number of less than 200,000 times, thereby being unacceptable, as shown in Table 1.

Considering the above, it is understood that meeting the following Expression (1) allows the bendability of the flexible printed board to be improved and meeting the following Expression (3) allows the bendability of the flexible printed board to be further improved.

$$0.75 \leq E_2/E_1 \leq 1.29 \qquad \text{Expression (1)}$$

$$0.79 \leq E_2/E_1 \leq 1.20 \qquad \text{Expression (3)}$$

Note that $E_1$ denotes the tensile elastic modulus of the shield conductive layer and $E_2$ denotes the tensile elastic modulus of the shield insulating layer.

Moreover, it is understood that, if the tensile elastic modulus $E_1$ of the shield conductive layer and the tensile elastic modulus $E_2$ of the shield insulating layer are equivalent to each other ($E_1=E_2$) as Example 3 shown in Table 1 and FIG. 9, the bendability of the flexible printed board is significantly improved.

Furthermore, it is understood that meeting the following Expression (2) allows the bendability of the flexible printed board to be improved and meeting the following Expression (4) allows the bendability of the flexible printed board to be further improved.

$$1.8[GPa] \leq E_2 \leq 3.1[GPa] \qquad \text{Expression (2).}$$

$$1.9[GPa] \leq E_2 \leq 2.88[GPa] \qquad \text{Expression (4).}$$

Note that it is also understood from the results of Examples 6 to 10 and Comparative Examples 3 and 4 that, even if the thickness of the adhesion layer of the coverlay film changes, similar tendency occurs as in the above Examples 1 to 5 and Comparative Examples 1 and 2.

It is additionally understood from the results of Examples 11 to 15 and Comparative Examples 5 and 6 that, also even if the average thickness of the shield conductive layer changes, similar tendency occurs as in the above Examples 1 to 5 and Comparative Examples 1 and 2.

Description of Reference Numerals

1 . . . sliding-type mobile phone
2 . . . flexible printed board
21 . . . insulating substrate
22 . . . circuit wiring
23 . . . circuit protection layer
231 . . . adhesion layer
232 . . . insulating film
24 . . . shield conductive layer
24a . . . concave portion
24b . . . convex portion
25 . . . shield insulating layer
30 . . . printing plate
31 . . . mask
32 . . . mesh

The invention claimed is:

1. A flexible printed board comprising:
an insulating substrate;
a circuit wiring laid on the insulating substrate;
a circuit protection layer laid on the circuit wiring;
a shield conductive layer laid on the circuit protection layer; and
a shield insulating layer laid on the shield conductive layer,
wherein the following Expression (1) is satisfied.

$$0.75 \leq E_2/E_1 \leq 1.29 \qquad \text{Expression (1)}$$

where $E_1$ denotes tensile elastic modulus of the shield conductive layer and $E_2$ denotes tensile elastic modulus of the shield insulating layer,
wherein the flexible printed board is configurable to having a bend radius of 0.7 mm in a slide test and reciprocate slidingly at least 200,000 times before the circuit wiring is broken.

2. The flexible printed board as set forth in claim 1, wherein the following Expression (2) is satisfied.

$$1.8 \text{ GPa} \leq E_2 \leq 3.1 \text{ GPa} \qquad \text{Expression (2).}$$

3. The flexible printed board as set forth in claim 2, wherein the following Expression (4) is satisfied:

$$1.9[GPa] \leq E_2 \leq 2.88[GPa] \qquad \text{Expression (4).}$$

4. The flexible printed board as set forth in claim 1, wherein the following Expression (3) is satisfied:

$$0.79 \leq E_2/E_1 \leq 1.20 \qquad \text{Expression (3).}$$

5. The flexible printed board as set forth in claim 1, wherein the tensile elastic modulus of the shield conductive layer and the tensile elastic modulus of the shield insulating layer are equivalent to each other.

6. The flexible printed board as set forth in claim 1, wherein
the shield conductive layer is formed by screen-printing conductive paste on the circuit protection layer and curing the conductive paste,
the shield insulating layer is formed by screen-printing insulating ink on the shield conductive layer and curing the insulating ink,
the shield conductive layer has a first surface facing the shield insulating layer,
the first surface is concave-convex shape,
the shield insulating layer has a second surface facing the first surface of the shield conductive layer, and
the second surface has a concave-convex shape corresponding to the shape of the first surface.

7. A method of manufacturing the flexible printed board as set forth in claims 1, comprising:
forming the shield conductive layer by screen-printing conductive paste on the circuit protection layer and curing the conductive paste; and
forming the shield insulating layer by screen-printing insulating ink on the shield conductive layer and curing the insulating ink.

* * * * *